United States Patent
Morita

(10) Patent No.: US 7,715,202 B2
(45) Date of Patent: May 11, 2010

(54) SUBSTRATE ATTACHMENT STRUCTURE

(75) Inventor: Shinji Morita, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 12/121,019

(22) Filed: May 15, 2008

(65) Prior Publication Data

US 2008/0291648 A1  Nov. 27, 2008

(30) Foreign Application Priority Data

May 22, 2007  (JP)  ............................. 2007-135001

(51) Int. Cl.
*H05K 5/00*  (2006.01)
(52) U.S. Cl. ...................... 361/759; 361/801
(58) Field of Classification Search ......... 361/801–802, 361/759, 769, 800, 790, 797, 752; 312/223
See application file for complete search history.

(56) References Cited

U.S. PATENT DOCUMENTS

| | | | | |
|---|---|---|---|---|
| 4,053,785 A | * | 10/1977 | Lee et al. ..................... | 250/574 |
| 5,691,504 A | * | 11/1997 | Sands et al. .................. | 174/372 |
| 5,796,593 A | * | 8/1998 | Mills et al. ................... | 361/801 |
| 6,115,243 A | * | 9/2000 | Horii ..................... | 361/679.09 |
| 6,362,978 B1 | * | 3/2002 | Boe ........................... | 361/825 |
| 6,398,043 B1 | * | 6/2002 | Wark et al. ................. | 211/41.17 |
| 6,903,933 B2 | * | 6/2005 | Wang ......................... | 361/727 |
| 7,212,400 B2 | * | 5/2007 | Fan et al. ................ | 361/679.58 |
| 7,364,442 B2 | * | 4/2008 | Bang et al. ..................... | 439/92 |
| 2005/0260888 A1 | | 11/2005 | Kanehira | |

FOREIGN PATENT DOCUMENTS

| JP | 49-3057 U | 1/1974 |
|---|---|---|
| JP | 63-12887 U | 1/1988 |
| JP | 02-20384 U | 2/1990 |
| JP | 03-16259 U | 2/1991 |

\* cited by examiner

*Primary Examiner*—Hung S Bui
(74) *Attorney, Agent, or Firm*—Global IP Counselors, LLP

(57) ABSTRACT

A substrate attachment structure includes a chassis, a substrate and an attachment screw. The chassis includes a hook piece with an engagement prong arranged to face the chassis, and a threaded hole. The substrate includes a screw insertion hole, and a latching hole with a continuous periphery that receives the hook piece of the chassis to sandwich a portion of the substrate between the engagement prong and a part of the chassis. The attachment screw is inserted through the screw insertion hole formed in the substrate and threaded into the threaded hole formed in the chassis to fasten the substrate to the chassis.

5 Claims, 4 Drawing Sheets

SUBSTRATE ATTACHMENT STRUCTURE

CROSS-REFERENCE TO RELATED APPLICATIONS

This application claims priority to Japanese Patent Application No. 2007-135001 filed on May 22, 2007. The entire disclosure of Japanese Patent Application No. 2007-135001 is hereby incorporated herein by reference.

BACKGROUND OF THE INVENTION

1. Field of the Invention

The present invention generally relates to a substrate attachment structure. More specifically, the prevent invention relates to a substrate attachment structure for attaching a substrate to a chassis.

2. Background Information

With a conventional substrate attachment structure, a substrate is attached to a chassis. Threaded holes for attachment screws are formed at two locations in the chassis. Screw insertion holes are formed at two locations in the substrate. When the attachment screws are fastened, the substrate is positioned overlapping the chassis, and the two screw insertion holes in the substrate are lined up with the two threaded holes in the chassis. Then, the attachment screws are inserted into the screw insertion holes and threaded into the threaded holes to fasten the substrate and the chassis together. With the conventional substrate attachment structure, two screw fastening locations are used to ensure necessary attachment strength and prevent the substrate from lifting up from the chassis. Therefore, if the substrate is large in size, then more than two locations need to be screwed down to ensure the necessary attachment strength.

With the conventional substrate attachment structure, after the substrate is positioned on the chassis and the screw insertion holes and threaded holes were lined up, the necessary number of the attachment screws has to be threaded in and tightened. Thus, positioning the substrate requires skill. Furthermore, fastening with attachment screws at two or more separate locations according to the size of the substrate is necessary to ensure the necessary attachment strength. As the number of screw fastening locations increased, the number of the screw fastening job also increased. Thus, the screw fastening job becomes complicated, which increases the manufacturing cost.

Meanwhile, with another conventional substrate attachment structure, a substrate is attached to a sheet metal without the use of attachment screws (see Japanese Laid-Open Utility Model Application H2-20384, for example). With the substrate attachment structure, the substrate is hooked at two places on left and right sides to receivers of the sheet metal. An elastic latching protrusion is provided to a distal end of a lead clamper. The elastic latching protrusion is inserted in and latched to holes provided to both the substrate and the sheet metal. The lead damper is utilized to support a lead wire.

The conventional substrate attachment structure fixes the substrate by hooking the substrate to the receivers of the sheet metal. With the conventional substrate attachment structure, an edge of the substrate is hooked to the receivers of the sheet metal. Furthermore, the lead damper is provided near an end of the substrate on the opposite side of the edge of the substrate.

However, depending on the type of electrical circuit formed on the substrate, it is conceivable that hooking the receivers to the edge of the substrate is unsuitable or even impossible. For instance, when electrical or electronic parts are mounted at the edge of the substrate, or when an electrical circuit pattern is formed at the edge of the substrate, the electrical or electronic parts get in the way of hooking the receivers, or the receivers short out an electrical path of the circuit.

In view of the above, it will be apparent to those skilled in the art from this disclosure that there exists a need for an improved substrate attachment structure. This invention addresses this need in the art as well as other needs, which will become apparent to those skilled in the art from this disclosure.

SUMMARY OF THE INVENTION

The present invention was conceived in light of the above-mentioned problem. One object of the present invention is to provide a substrate attachment structure with which necessary attachment strength is ensured with the number of screw being reduced.

In accordance with one aspect of the present invention, a substrate attachment structure includes a chassis, a substrate and an attachment screw. The chassis includes a hook piece with an engagement prong arranged to face the chassis, and a threaded hole. The substrate includes a screw insertion hole, and a latching hole with a continuous periphery that receives the hook piece of the chassis to sandwich a portion of the substrate between the engagement prong and a part of the chassis. The attachment screw is inserted through the screw insertion hole formed in the substrate and threaded into the threaded hole formed in the chassis to fasten the substrate to the chassis.

With the substrate attachment structure of the present invention, it is possible to provide a substrate attachment structure with which necessary attachment strength is ensured with the number of screw being reduced.

These and other objects, features, aspects and advantages of the present invention will become apparent to those skilled in the art from the following detailed descriptions, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

A preferred embodiment of the present invention will now be explained with reference to the drawings. It will be apparent to those skilled in the art from this disclosure that the following description of the preferred embodiment of the present invention is provided for illustration only and not for the purpose of limiting the invention as defined by the appended claims and their equivalents.

As shown in FIGS. 1 to 5, a substrate attachment structure for attaching a substrate 20 to a chassis 10 includes a hook attachment structure 1 and a screw attachment structure 2. The substrate attachment structure is provided to electric devices, such as display devices, video reproduction devices, etc.

Figure 1:
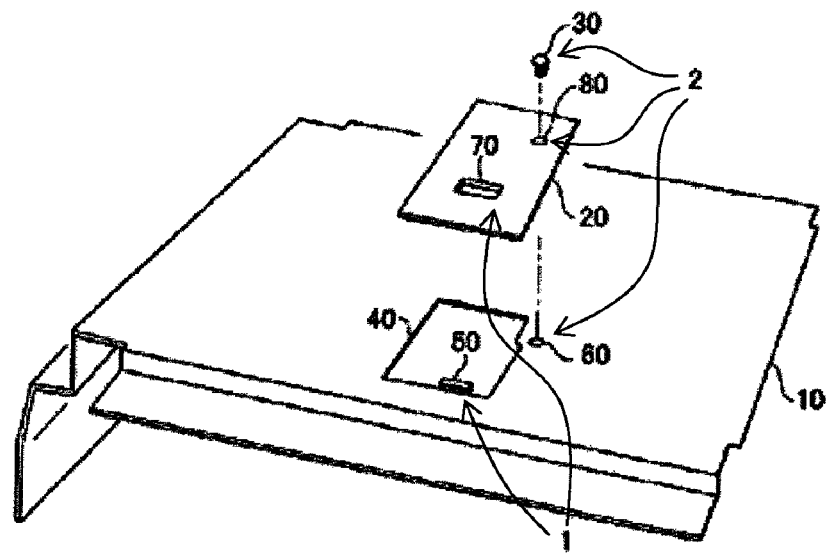
FIG. 1 is an exploded perspective view of a substrate attachment structure of a chassis and a substrate in accordance with one embodiment of the present invention.
Figure 2:
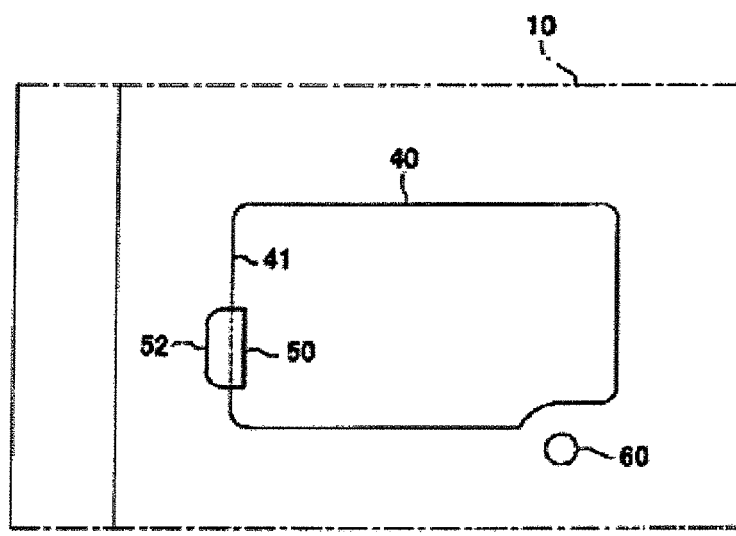
FIG. 2 is a partial top plan view of the chassis illustrated in FIG. 1.
Figure 3:
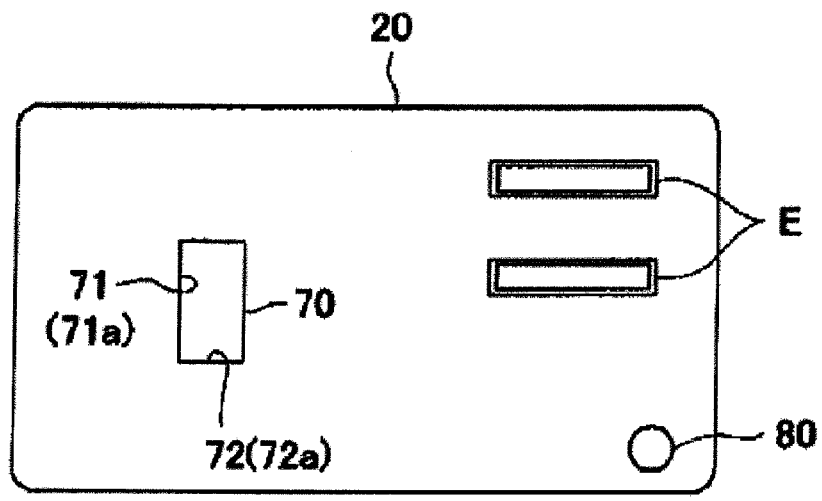
FIG. 3 is a top plan view of the substrate illustrated in FIG. 1.

The chassis 10 is made of sheet metal. The chassis 10 has a window 40, a single hook piece 50 and a threaded hole 60. The window 40 has a substantially rectangular shape opening. The window 40 is formed by punching out a part of the chassis 10. The hook piece 50 is integrally formed with the chassis 10 by cutting and raising up a part of the chassis 10. Specifically, the hook piece 50 is formed by bending an extension portion of the chassis 10 extending inward from a part of an edge 41 of the window 40. The threaded hole 60 for an attachment screw 30 is formed by burring at a location near the window 40. Meanwhile, the substrate 20 includes a rectangular latching hole 70 and a screw insertion hole 80. Furthermore, as shown in FIG. 3, electrical or electronic parts E are mounted on the substrate 20. The substrate 20 has a substantially rectangular shape. The latching hole 70 is formed at a location in the substantially rectangular substrate 20. The latching hole 70 is a closed through-hole having a continuous inner periphery. The screw insertion hole 80 is formed at another location of the location of the latching hole 70. The hook attachment structure 1 includes the hook piece 50 of the chassis 10 and the latching hole 70 of the substrate 20. The screw attachment structure 2 includes the attachment screw 30, the threaded hole 60 of the chassis 10 and the screw insertion hole 80 of the substrate 20.

As shown in FIGS. 6 to 9, the hook piece 50 has a leg piece 51 and an engagement prong 52. The leg piece 51 is bent at a right angle to one side of the chassis 10 at one location of the edge 41 of the window 40. In other words, the leg piece 51 extends from the edge 41 of the window 40 in a direction perpendicular to the chases 10. The engagement prong 52 is bent with respect to the leg piece 51 at a distal end of the leg piece 51 so that the engagement prong 52 faces the chassis 10 with a gap therebetween. The gap between the chassis 10 and the engagement prong 52 is set to be substantially equal to the thickness of the substrate 20.

The latching hole 70 is a through-hole made at one location of the substrate 20 by punching. Specifically, the location where the latching hole 70 is formed is a location that does not include an outer periphery of the substrate 20. In other words, the latching hole 70 is a closed through-hole having a continuous inner periphery defining inner side of the latching hole 70. The continuous inner periphery receives the hook piece 50 of the chassis 10 to sandwich a portion of the substrate 20 between the engagement prong 52 and a part of the chassis 10. The latching hole 70 is formed as a rectangle. However, the latching hole 70 can be formed in a partially circular shape or a polyhedral shape that is closed all the way around the periphery. Therefore, the latching hole 70 does not include a hole that is open at a side starting at the outer periphery of the substrate 20. Accordingly, the latching hole 70 can be freely formed at a location that does not interfere a soldering region, a location where the circuit pattern is formed on the substrate 20, or the location where the electrical or electronic parts E are mounted. Also, the latching hole 70 is formed large enough to allow the insertion of the hook piece 50 of the chassis 10.

Furthermore, a location of the screw insertion hole 80 has a specific relationship with respect to a location of the latching hole 70. The positional relationship between the latching hole 70 and the screw insertion hole 80 is determined according to the positional relationship between the threaded hole 60 and the hook piece 50 of the chassis 10.

Next, a substrate attachment procedure for attaching the substrate 20 to the chassis 10 using the single attachment screw 30 will be described through reference to FIGS. 4 to 9.

Figure 4:
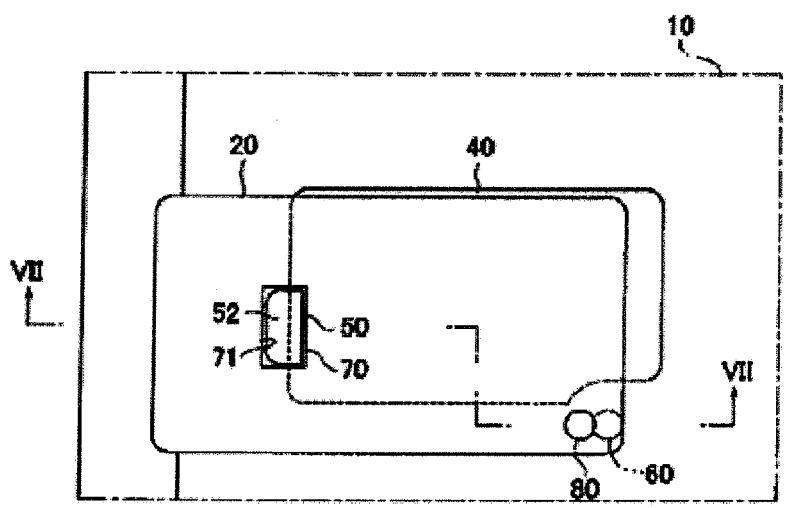
FIG. 4 is a top plan view of the substrate attachment structure illustrated in FIG. 1 illustrating a first step in a substrate attachment procedure.
Figure 6:
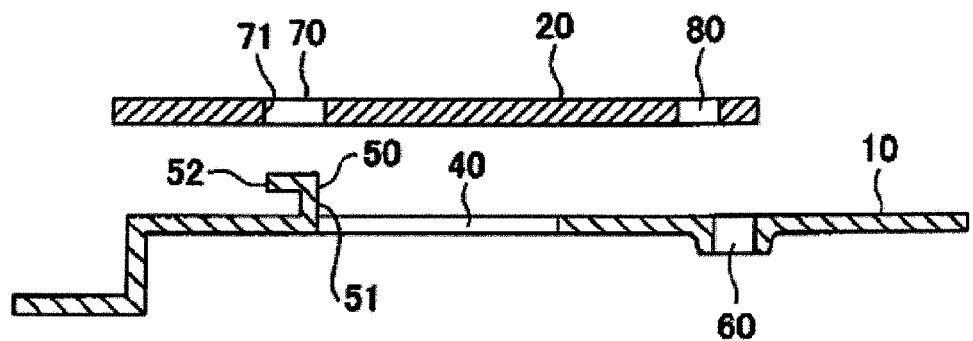
FIG. 6 is a cross sectional view of the substrate attachment structure illustrating the first step in the substrate attachment procedure.
Figure 7:
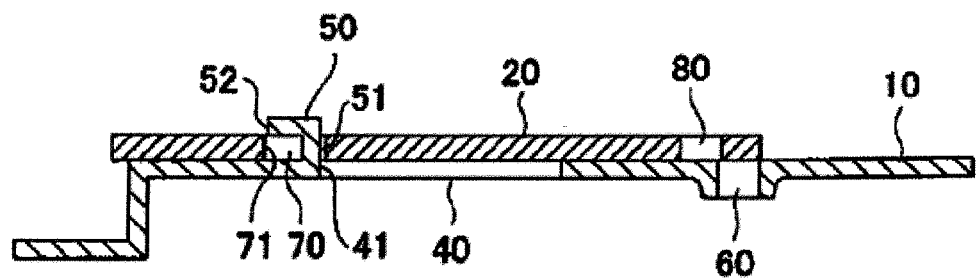
FIG. 7 is a cross sectional view of the substrate attachment structure taken along VII-VII line in FIG. 4 illustrating the first step in the substrate attachment procedure.

In a first step of the procedure, as shown in FIG. 6, the substrate 20 is positioned opposite the chassis 10. Then, as shown in FIGS. 4 and 7, the hook piece 50 of the chassis 10 is inserted in the latching hole 70 of the substrate 20 so that the substrate 20 is superposed over the chassis 10.

Figure 5:
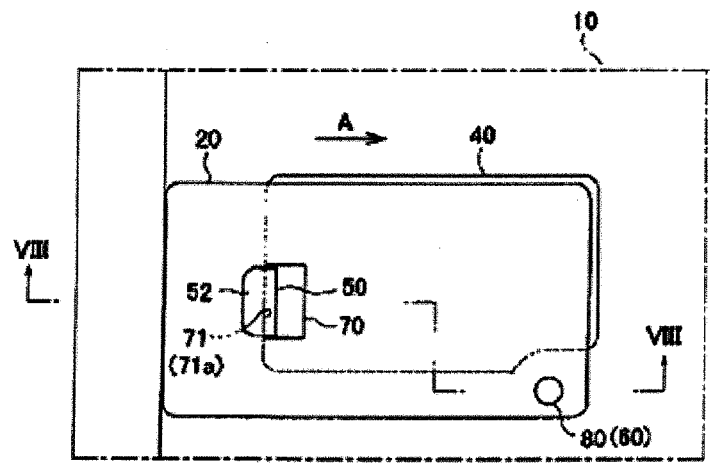
FIG. 5 is a top plan view of the substrate attachment structure illustrated in FIG. 1 illustrating a middle step in the substrate attachment procedure.
Figure 8:
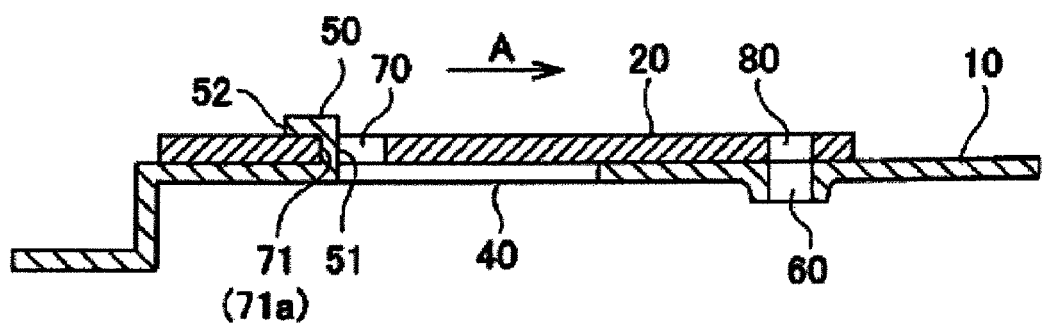
FIG. 8 is a cross sectional view of the substrate attachment structure taken along VIII-VIII line in FIG. 4 illustrating the middle step in the substrate attachment procedure.

In a middle step of the procedure, the substrate 20 is slid over the chassis 10 in a direction indicated by an arrow A shown in FIGS. 5 and 8 so that one location of the edge of the latching hole 70, namely, a long side 71 of four sides of the latching hole 70, is latched to the leg piece 51 of the hook piece 50. In other words, the substrate 20 is slid over the chassis 10 in a direction opposite the direction in which the engagement prong 52 extends from the leg piece 51. The positional relationship between the latching hole 70 and the screw insertion hole 80 is such that when the long side 71 of the latching hole 70 is latched to the leg piece 51 of the hook piece 50, the screw insertion hole 80 lines up with the threaded hole 60 of the chassis 10. Therefore, just by performing the middle step in which the substrate 20 is slid over the chassis 10 in the direction indicated by the arrow A so that the long side 71 of the latching hole 70 is latched to the leg piece 51 of the hook piece 50, the screw insertion hole 80 lines up with the threaded hole 60 of the chassis 10. Since there can be a certain amount of play between the latching hole 70 and the hook piece 50, it is necessary to perform a simple positional adjustment in which the play is utilized to line up the screw insertion hole 80 with the threaded hole 60.

Figure 9:
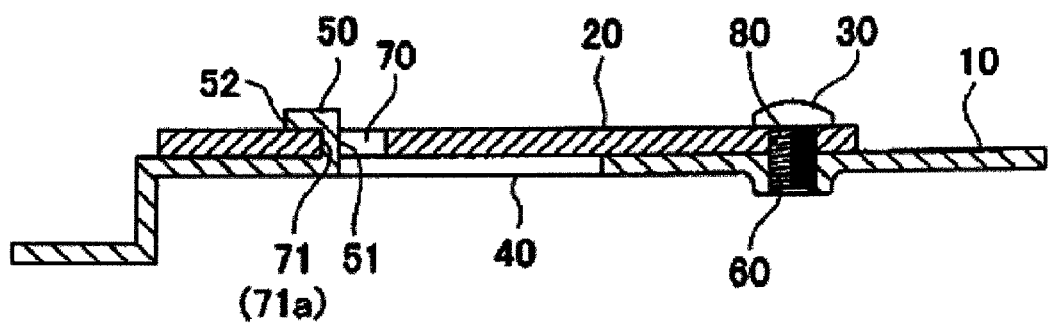
FIG. 9 is a cross sectional view of the substrate attachment structure illustrating a last step in the substrate attachment procedure.

In a last step, as shown in FIG. 9, the attachment screw 30 is inserted in the screw insertion hole 80 of the substrate 20 and threaded into and tightened in the threaded hole 60 of the chassis 10.

When the above steps are performed, the substrate 20 is fastened and fixed to the chassis 10 with the single attachment screw 30. After attachment, as shown in FIG. 9, adequate attachment strength is ensured because the long side 71 of the latching hole 70 is sandwiched by the chassis 10 and the engagement prong 52 of the hook piece 50, and because an edge of the screw insertion hole 80 is sandwiched by the chassis 10 and a head of the attachment screw 30. Also, the latching hole 70 is formed at a location that does not include the soldering region, the location where the circuit pattern is formed on the substrate 20, or the location where the electrical or electronic parts E. Thus, the substrate attachment structure having the hook piece 50 and the latching hole 70 does not pose any mechanical or electrical problems.

In this embodiment, the window 40 of the chassis 10 exposes the soldering region or the circuit pattern of the substrate that is attached through the above steps. Thus, the window 40 serves to prevent the soldering region or the circuit pattern from contacting with the chassis 10.

In this embodiment, the long side 71 of the latching hole 70 forms a sandwiched component 71a, which is sandwiched by the chassis 10 and the engagement prong 52 of the hook piece 50. Furthermore, as shown in FIG. 3, a short side 72 of the latching hole 70 forms an abutting component 72a. In the last step of the procedure shown in FIG. 9, when the attachment screw 30 is threaded into the threaded hole 60 of the chassis 10, the abutting component 72a abuts with the leg piece 51 so that the abutting component 72a is latched to the leg piece 51 of the hook piece 50. Preferably, the length of the long side 71 is set to be substantially equal to the width of the leg piece 51. Furthermore, the abutting component 72a prevents the substrate 20 from turning along with the attachment screw 30. Accordingly, when the attachment screw 30 is threaded in, the substrate 20 will not turn along with the attachment screw 30. Therefore, the job of tightening the attachment screw 30 is easily accomplished, which helps to increase mass productivity.

The substrate attachment structure includes the hook attachment structure 1 in which the hook piece 50 is hooked to one location of the edge of the latching hole 70 of the substrate 20. The latching hole 70 of the substrate 20 is a through-hole made at one location that does not include the edge of the substrate 20. Thus, a location that is away from the location where the hooking of the hook piece 50 is unsuitable or impossible can be freely selected as the location where the latching hole 70 is formed. Accordingly, any electrical or electronic parts E can be prevented from getting in the way of hooking the hook piece 50. Furthermore, the electrical path of the circuit can be prevented from being shorted out by the hook piece 50. Moreover, the number of screw fastening locations can be reduced to just one. Thus, the number of the attachment screws 30 can be reduced to a single screw. Therefore, less labor is entailed by fastening the attachment screws 30, and this lowers the production cost.

With the substrate attachment structure, the soldering region and the circuit pattern of the substrate 20 do not overlap with the chassis 10. Thus, there is no risk that they will be damaged or electrically shorted. Also, the window 40 is merely formed by what is left after punching out a location where the window 40 is to be formed in the chassis 10. Thus, forming the hook piece 50 by cutting and raising up the edge 41 of the window 40 reduces the waste material that is left over after punching.

With the substrate attachment structure, the hook piece 50 is inserted into the latching hole 70 of the substrate 20 when the substrate 20 is laid over the chassis 10. Then, the hook piece 50 is hooked in the latching hole 70. Thus, the step of hooking the hook piece 50 in the latching hole 70 becomes easier, and this helps improve the mass productivity of the substrate attachment structure.

With the substrate attachment structure, the screw insertion hole 80 of the substrate 20 is formed at a location that aligns with the threaded hole 60 of the chassis 10 when the hook piece 50 is inserted into the latching hole 70 of the substrate 20 and the substrate 20 is then slid over the chassis 10 to latch the leg piece 51 of the hook piece 50 at one location of the edge of the latching hole 70. As a result, in the substrate attachment procedure, the job of hooking the hook piece 50 of the chassis 10 in the latching hole 70 of the substrate 20 can be carried out simultaneously with the job of aligning and positioning the screw insertion hole 80 of the substrate 20 with the threaded hole 60 of the chassis 10, which makes the work much easier and better suited to mass production.

With the substrate attachment structure, the job of threading and tightening the attachment screw 30 can be facilitated because the substrate 20 does not turn with the attachment screw 30 during the work.

With the substrate attachment structure, the hook attachment structure 1 is provided. Thus, the substrate attachment procedure can be completed merely by performing screw fastening at one location. Therefore, the number of screw fastening locations is reduced, and the substrate 20 can be easily attached to the chassis 10 with just one attachment screw 30. In particular, the latching hole 70 of the substrate 20 is formed by a through-hole made at one location that does not include the edge of the substrate 20. Thus, even if hooking the hook piece 50 to the edge of the substrate 20 is unsuitable or impossible, the substrate 20 can still be screwed to the chassis 10 with just one attachment screw 30.

GENERAL INTERPRETATION OF TERMS

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of a liquid crystal module equipped with the present invention. Accordingly, these terms, as utilized to describe the present invention should be interpreted relative to an electric devices equipped with the present invention as used in the normal operating position.

While a preferred embodiment has been chosen to illustrate the present invention, it will be apparent to those skilled in the art from this disclosure that various changes and modifications can be made herein without departing from the scope of the invention as defined in the appended claims. Furthermore, the foregoing description of the preferred embodiment according to the present invention is provided for illustration only, and not for the purpose of limiting the invention as defined by the appended claims and their equivalents.

What is claimed is:

1. A substrate attachment structure comprising:
   a chassis including an attachment face with an opening, a hook piece with a leg piece and an engagement prong, the leg piece being formed on the attachment face and extending from an edge portion of the opening of the attachment face, the engagement prong extending from a distal end portion of the leg piece outward of the opening of the attachment face relative to the leg piece with the engagement prong facing the attachment face of the chassis in a direction perpendicular to the attachment face, and a single threaded hole that is formed on the attachment face of the chassis;
   a substrate disposed on the attachment face of the chassis, the substrate including a single screw insertion hole, and a latching hole with a continuous periphery that receives the hook piece of the chassis to sandwich a portion of the substrate between the engagement prong and the attachment face of the chassis in the direction perpendicular to the attachment face, the leg piece of the hook piece restricting an inward movement of the substrate inward of the opening of the attachment face relative to the leg piece with the inward of the opening directing opposite the outward of the opening; and a single attachment screw disposed through the screw insertion hole that is formed in the substrate and threaded into the threaded hole that is formed on the attachment face of the chassis to fasten the substrate to the chassis, distance between the attachment face and the engagement prong of the chassis in the direction perpendicular to the attachment face being at least thickness of the substrate along the latching hole of the substrate.

2. The substrate attachment structure according to claim 1, wherein the opening of the attachment face exposes a soldering region or a circuit pattern of the substrate.

3. The substrate attachment structure according to claim 2, wherein the leg piece of the hook piece extends from the edge portion of the opening in the direction perpendicular to the attachment face, and the latching hole is formed in a size that allows the hook piece to be inserted.

4. The substrate attachment structure according to claim 3, wherein the screw insertion hole of the substrate is formed at a location that aligns with the threaded hole of the chassis when the hook piece of the chassis is inserted into the latching hole of the substrate and the leg piece of the hook piece abuts an edge of the latching hole.

5. The substrate attachment structure according to claim 4, wherein the latching hole of the substrate has a rectangular shape with four sides, one of the four sides of the latching hole being sandwiched between the attachment face of the chassis and the engagement prong of the hook piece, another one of the four sides abutting with the leg piece of the hook piece to prevent the substrate from turning with the attachment screw when the attachment screw is threaded into the threaded hole of the chassis.

* * * * *